United States Patent
McLaren et al.

(10) Patent No.: US 9,979,360 B1
(45) Date of Patent: May 22, 2018

(54) MULTI BASEBAND TERMINATION COMPONENTS FOR RF POWER AMPLIFIER WITH ENHANCED VIDEO BANDWIDTH

(71) Applicant: NXP USA, Inc., Austin, TX (US)

(72) Inventors: Roy McLaren, Gilbert, AZ (US); Ning Zhu, Chandler, AZ (US); Damon G. Holmes, Scottsdale, AZ (US); Jeffrey Kevin Jones, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 0 days. days.

(21) Appl. No.: 15/385,647

(22) Filed: Dec. 20, 2016

(51) Int. Cl.
- *H03F 3/191* (2006.01)
- *H03F 1/56* (2006.01)
- *H03F 3/195* (2006.01)
- *H01L 23/66* (2006.01)

(52) U.S. Cl.
CPC ............ *H03F 1/565* (2013.01); *H01L 23/66* (2013.01); *H03F 3/195* (2013.01); *H01L 2223/6611* (2013.01); *H01L 2223/6655* (2013.01); *H01L 2223/6672* (2013.01); *H03F 2200/387* (2013.01); *H03F 2200/391* (2013.01); *H03F 2200/451* (2013.01)

(58) Field of Classification Search
CPC ...................................... H03F 3/191
USPC ........................ 330/306, 302, 305
See application file for complete search history.

(56) References Cited

U.S. PATENT DOCUMENTS

| | | | |
|---|---|---|---|
| 8,659,359 B2* | 2/2014 | Ladhani | H03F 1/0288 330/302 |
| 8,963,645 B1* | 2/2015 | Helms | H03F 3/195 330/307 |
| 8,970,299 B2* | 3/2015 | Hase | H03F 3/191 330/140 |
| 9,106,187 B2 | 8/2015 | Ladhani et al. | |
| 9,190,965 B2 | 11/2015 | Ladhani et al. | |
| 2016/0344353 A1 | 11/2016 | Watts et al. | |

* cited by examiner

*Primary Examiner* — Henry Choe

(57) ABSTRACT

An RF amplifier includes a transistor, a shunt circuit, an envelope frequency termination circuit, and an extra lead. The shunt circuit is coupled between a transistor current carrying terminal and a ground reference node. The shunt circuit has a shunt inductive element and a shunt capacitor coupled in series, with an RF cold point node between the shunt inductive element and the shunt capacitor. The envelope frequency termination circuit is coupled between the RF cold point node and the ground reference node. The envelope frequency termination circuit has an envelope resistor, an envelope inductive element, and an envelope capacitor coupled in series. The extra lead is electrically coupled to the RF cold point node. The extra lead provides a lead inductance in parallel with an envelope inductance provided by the envelope inductive element. An additional shunt capacitor can be coupled between the extra lead and ground.

19 Claims, 7 Drawing Sheets

US 9,979,360 B1

MULTI BASEBAND TERMINATION COMPONENTS FOR RF POWER AMPLIFIER WITH ENHANCED VIDEO BANDWIDTH

TECHNICAL FIELD

Embodiments of the subject matter described herein relate generally to packaged semiconductor devices, and more particularly to packaged, radio frequency (RF) semiconductor devices that include impedance matching circuits.

BACKGROUND

High power, radio frequency (RF) transistor devices are commonly used in RF communication infrastructure amplifiers. These RF transistor devices typically include one or more input leads, one or more output leads, one or more transistors, one or more bias leads, and various bondwires coupling the leads to the transistor(s). In some cases, input and output circuits also may be contained within the same package that contains the device's transistor(s). More specifically, an in-package input circuit (e.g., including an input impedance matching circuit) may be coupled between a device's input lead and a control terminal (e.g., the gate) of a transistor, and an in-package output circuit (e.g., including an output impedance matching circuit) may be coupled between a current conducting terminal (e.g., the drain) of a transistor and a device's output lead.

Instantaneous signal bandwidth (ISBW)/video bandwidth (VBW) is becoming a major requirement for RF communication infrastructure amplifiers, and thus for the high-power RF transistor devices included in such amplifiers. Along with an impedance matching circuit, an RF device's output circuit also may include a baseband decoupling circuit configured to provide an AC ground down to envelope frequencies. Generally, the ISBW of the device is limited by the low frequency resonance (LFR) caused by interaction among the device's bias feeds, other inductive elements and transistor parasitic capacitance as well any capacitance associated with an output impedance matching circuit. In recent years, RF transistor devices including a baseband decoupling circuit have been developed with limited LFRs in the range of about 450 megahertz (MHz) or less, which supports ISBWs in the range of about 150 MHz or less. Although these devices are sufficient for some applications, the requirement to support wider RF bandwidth amplifiers continues to increase.

As the design and ability to scale in-package internal baseband decoupling circuits is improved to further increase the frequency of the low frequency resonance (LFR), an undesirable side effect can be insufficient damping of resonances with very low frequencies, for example in the hundreds of kilohertz (kHz) to tens of megahertz (MHz) baseband frequency range. These very low frequency (VLF) resonances present themselves as long term memory effects that can disrupt digital predistortion (DPD) correction in the channels adjacent to the primary carrier(s). Accordingly, high-power RF transistor devices are needed that include output circuits that are capable of higher LFRs and ISBWs and that are capable of mitigating disruptive VLF resonances.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
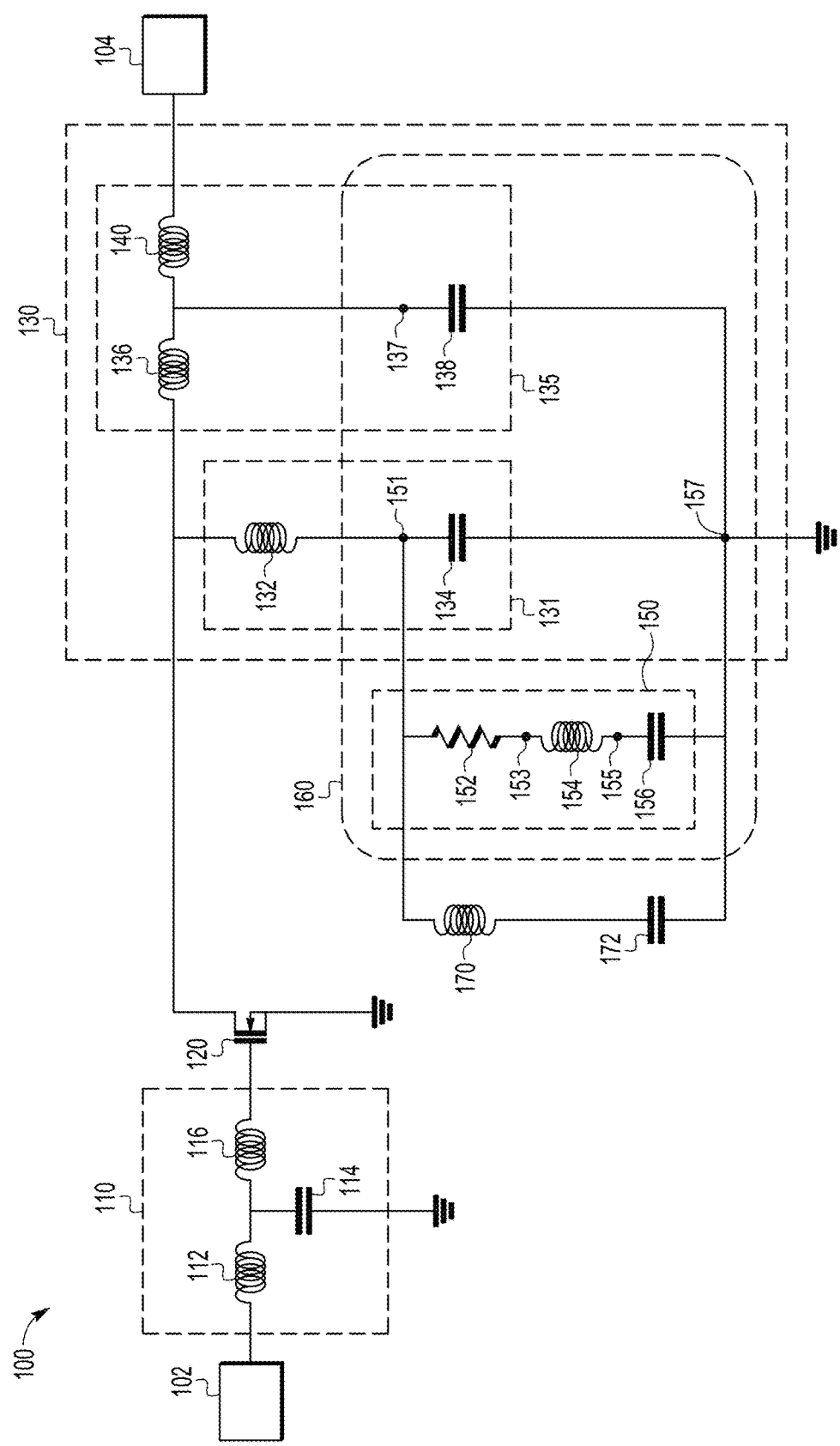
FIG. 1 is a schematic diagram of an RF amplifier with input and output circuits, in accordance with an example embodiment.

For RF power amplifier applications, the ability to scale in-package baseband decoupling circuits with transistor periphery is known to improve baseband impedance performance by eliminating low frequency resonances (LFR) from the impedance matching circuits. However, an undesirable side effect of such scaling can be insufficient damping of very low frequency (VLF) resonance, for example in the hundreds of kilohertz (kHz) to tens of megahertz (MHz) baseband frequency range. Those VLF resonances present themselves as long term memory effects that can disrupt digital predistortion (DPD) correction in communication systems that require linear transmitters. To address the VLF resonance issues, embodiments of RF amplifiers are provided in which an extra lead inductance is incorporated in parallel with an envelope inductance of the baseband decoupling circuits. As a result, the extra lead inductance can reduce the equivalent inductance of the output circuit, and thus effectively dampen the VLF resonances. This method of dampening the VLF resonances may help to reduce DPD complexity and power consumption resulting from the long term memory effect, and improve the corrected linearity of the transmitter.

A conventional high power RF amplifier device includes an active device (e.g., a transistor), an input impedance matching circuit coupled between an input to the RF amplifier device and an input to the active device, and an output circuit (including an output impedance matching circuit) coupled between an output of the active device and an output of the RF amplifier device.

Embodiments of RF amplifiers discussed herein also include a baseband decoupling circuit in the output circuit, which is configured to provide an RF ground down to envelope frequencies. For example, a baseband decoupling circuit may include an envelope resistor, envelope inductor and envelope capacitor connected in series between the transistor's conducting terminal and ground. To help minimize RF leakage through the baseband decoupling circuit, the non-grounded terminal of the baseband decoupling circuit can be connected to an RF cold point in the output circuit. Such an RF cold point may, for example, be generated by an appropriately designed impedance matching circuit. The envelope resistor is mainly intended to dampen the higher frequency primary baseband resonance, but will also provide a general damping at other baseband frequencies. Consequently one approach to mitigate VLF resonances may be to increase the value of an envelope resistor in series with a VBW capacitance, but increasing the resistance beyond a critical value may lead to an undesirable increase in baseband impedances, and for many applications also increase power dissipation resulting in degraded efficiency.

These RF amplifier device embodiments include output circuit components, or output integrated passive devices (IPDs), that may support wider RF bandwidth amplifiers than are achievable using conventional components, while meeting various performance requirements and other criteria. For example, assuming a 3:1 ratio of low frequency resonance (LFR) to instantaneous signal bandwidth (ISBW), embodiments may enable transmission of signals with a 200 megahertz (MHz) or above ISBW, which corresponds to low LFRs of approximately 600 MHz or greater. In other cases, the LFR to ISBW ratio could be from 2.4:1 to 5:1, depending on the system used for linearization (e.g., the digital pre-distortion (DPD) system).

In various embodiments, the output IPD can be implemented with different technologies, such as, but not limited to, ceramic and silicon. In the output IPD component, a baseband decoupling circuit with a relatively large capacitance value, referred to herein as an envelope capacitance or "$C_{env}$," is used to achieve an increased LFR (and thus increased ISBW). According to an embodiment, $C_{env}$, which has a high capacitance value with a relatively small form factor, can be implemented with different technologies. Using ceramic, for example, $C_{env}$ may be coupled with (e.g., co-fired with) one or more other ceramic capacitors of the output circuit. In such an embodiment, $C_{env}$ includes relatively low quality factor (Q) (e.g., high dielectric constant), ceramic material between its electrodes, and the other ceramic capacitors include relatively high Q (e.g., low dielectric constant) ceramic material between their electrodes. Said another way, capacitors of the baseband decoupling circuit and the output impedance matching circuit are implemented in a ceramic device (referred to herein as "multi-dielectric ceramic device") that includes one or more first capacitors implemented in a dielectric material having a first Q, and one or more second capacitors implemented in a dielectric material having a different Q. Embodiments also include packaged RF transistor devices that include such multi-dielectric ceramic devices, and RF amplifiers that include such packaged RF transistor devices. Besides ceramic technology, silicon technology can be applied to achieve similar functionality as well, i.e., one or more first capacitors having a first Q, and one or more second capacitors having a different Q.

As indicated above, $C_{env}$ can be implemented with one or more other capacitors on a single output IPD. This design methodology enables the shorter distance between the VBW circuit and the die reference plane, which may enhance performance. In addition, this methodology enables the design ability to scale in-package internal baseband decoupling circuits to further increase the frequency of the low frequency resonance (LFR). As a result, this allows for a relatively high LFR (and thus a relatively wide ISBW).

Although this approach can improve LFR to a higher frequency (for example, up to 1 gigahertz (GHz) or higher), the above circuits might experience very low frequency (VLF) resonance (at frequencies ranging from, for example, about 8 MHz to 20 MHz), making linearization difficult. In certain exemplary embodiments, the envelope frequency termination circuit may incorporate an extra lead inductance in parallel with an envelope inductance, effectively reducing the equivalent inductance of the output circuit of the amplifier. This approach uses complimentary drain extra lead decoupling to mitigate VLF resonance, and helps achieve a more scalable baseband termination.

FIG. 1 is a schematic diagram of an RF amplifier device 100. Device 100 includes an input lead 102, an input impedance matching circuit 110, a transistor 120, an output impedance matching circuit 130, an envelope frequency termination circuit 150, and an output lead 104, in an embodiment. The output impedance matching circuit 130 and the envelope frequency termination circuit 150 may be referred to collectively as an "output circuit." Although transistor 120 and various elements of the input and output impedance matching circuits 110, 130 and the envelope frequency termination circuit 150 are shown as singular components, the depiction is for the purpose of ease of explanation only. Those of skill in the art would understand, based on the description herein, that transistor 120 and/or certain elements of the input and output impedance matching circuits 110, 130 and the envelope frequency termination circuit 150 each may be implemented as multiple components (e.g., connected in parallel or in series with each other), and examples of such embodiments are illustrated in the other Figures and described later. For example, embodiments may include single-path devices (e.g., including a single input lead, output lead, transistor, etc.), dual-path devices (e.g., including two input leads, output leads, transistors, etc.), and/or multi-path devices (e.g., including two or more input leads, output leads, transistors, etc.). Further, the number of input/output leads may not be the same as the number of transistors (e.g., there may be multiple transistors operating in parallel for a given set of input/output leads). The description of transistor 120 and various elements of the input and output impedance matching circuits 110, 130 and the envelope frequency termination circuit 150, below, thus are not intended to limit the scope of the inventive subject matter only to the illustrated embodiments.

Input lead 102 and output lead 104 each include a conductor, which is configured to enable the device 100 to be electrically coupled with external circuitry (not shown). More specifically, input and output leads 102, 104 are physically located between the exterior and the interior of the device's package. Input impedance matching circuit 110 is electrically coupled between the input lead 102 and a first terminal of transistor 120, which is also located within the device's interior, and output impedance matching circuit 130 and envelope frequency termination circuit 150 are electrically coupled between a second terminal of transistor 120 and the output lead 104.

According to an embodiment, transistor 120 is the primary active component of device 100. Transistor 120 includes a control terminal and two current conducting terminals, where the current conducting terminals are spatially and electrically separated by a variable-conductivity channel. For example, transistor 120 may be a field effect transistor (FET) (such as a metal oxide semiconductor FET (MOSFET)) or a high electron mobility transistor (HEMT), each of which includes a gate (control terminal), a drain (a first current conducting terminal), and a source (a second current conducting terminal). Alternatively, transistor 120 may be a bipolar junction transistor (BJT). Accordingly, references herein to a "gate," "drain," and "source," are not intended to be limiting, as each of these designations has analogous features for a BJT implementation (e.g., a base, collector, and emitter, respectively). According to an embodiment, and using nomenclature typically applied to MOSFETs in a non-limiting manner, the gate of transistor 120 is coupled to the input impedance matching circuit 110, the drain of transistor 120 is coupled to the output impedance matching circuit 130 and the envelope frequency termination circuit 150, and the source of transistor 120 is coupled to ground (or another voltage reference). Through the variation of control signals provided to the gate of transistor 120, the current between the current conducting terminals of transistor 120 may be modulated.

Input impedance matching circuit 110 is configured to raise the impedance of device 100 to a higher (e.g., intermediate or higher) impedance level (e.g., in a range from about 2 to about 10 Ohms or higher). This is advantageous in that it allows the printed circuit board level (PCB-level) matching interface from a driver stage to have an impedance that can be achieved in high-volume manufacturing with minimal loss and variation (e.g., a "user friendly" matching interface). Input impedance matching circuit 110 is coupled between the input lead 102 and the control terminal (e.g., gate) of the transistor 120. According to an embodiment, input impedance matching circuit 110 is a low pass circuit, which includes two inductive elements 112, 116 (e.g., two sets of bondwires) and a shunt capacitor 114. A first inductive element 112 (e.g., a first set of bondwires) is coupled between input lead 102 and a first terminal of capacitor 114, and a second inductive element 116 (e.g., a second set of bondwires) is coupled between the first terminal of capacitor 114 and the control terminal of transistor 120. The second terminal of capacitor 114 is coupled to ground (or another voltage reference). The combination of inductive elements 112, 116 and shunt capacitor 114 functions as a low-pass filter. According to an embodiment, the series combination of inductive elements 112, 116 may have a value in a range between about 50 picohenries (pH) to about 3 nanohenries (nH), and shunt capacitor 114 may have a value in a range between about 2 picofarads (pF) to about 100 pF.

Output impedance matching circuit 130 is configured to match the output impedance of device 100 with the input impedance of an external circuit or component (not shown) that may be coupled to output lead 104. Output impedance matching circuit 130 is coupled between the first current conducting terminal (e.g., drain) of transistor 120 and the output lead 104. According to an embodiment, output impedance matching circuit 130 includes three inductive elements 132, 136, 140 (e.g., three sets of bondwires) and two capacitors 134, 138. Output impedance matching circuit 130 includes a high-pass matching circuit 131 (including inductive element 132 and capacitor 134) and a low-pass matching circuit 135 (including inductive elements 136, 140 and capacitor 138), in an embodiment.

In the low-pass matching circuit 135, inductive elements 136, 140 (e.g., third and fourth sets of bondwires), also referred to herein as "$L_{LP1}$" and $L_{LP2}$," are coupled in series between the first current conducting terminal (e.g., drain) of transistor 120 and the output lead 104, with node 137 between inductive elements 136, 140. Capacitor 138, also referred to herein as "$C_{LP}$," has a first terminal coupled to node 137, and a second terminal coupled to a ground node 157, which in turn may be coupled to ground (or to another voltage reference). The combination of inductive elements 136, 140 and capacitor 138 functions as a first (low-pass) matching stage. According to an embodiment, the series combination of inductive elements 136, 140 may have a value in a range between about 40 pH to about 3 nH, and capacitor 138 may have a value in a range between about 2 pF to about 80 pF, although these components may have values outside of these ranges, as well.

In the high-pass matching circuit 131, inductive element 132 (e.g., a fifth set of bondwires), also referred to as "$L_{shunt}$," is coupled between the first current conducting terminal of transistor 120 and a first terminal of capacitor 134, also referred to as "$C_{shunt}$." A second terminal of capacitor 134 is coupled to a ground node 157. The combination of inductive element 132 and capacitor 134 functions as a second (high-pass) matching stage. According to an embodiment inductive element 132 may have a value in a range between about 80 pH to about 3 nH, and capacitor 134 may have a value in a range between about 50 pF to about 500 pF, although these components may have values outside of these ranges, as well.

An RF "cold point" is present at the node 151 between inductive element 132 and capacitor 134, where the RF cold point represents a high impedance point in the circuit to signals having RF frequencies. Envelope frequency termination circuit 150 is coupled between the RF cold point (at node 151) and ground node 157, in an embodiment. Envelope frequency termination circuit 150 can function to improve the low frequency resonance of device 100 caused by the interaction between the output impedance matching circuit 130 and the external bias feeds by presenting a high impedance at RF frequencies. Envelope frequency termination circuit 150 essentially is "invisible" from a matching standpoint, as it only effects the output impedance at envelope frequencies (i.e., envelope frequency termination circuit 150 provides terminations for the envelope frequencies of device 100).

According to an embodiment, envelope frequency termination circuit 150 includes a resistor 152, an inductance 154, and a capacitor 156 coupled in series. A first terminal of resistor 152, referred to herein as an "envelope resistor" or "$R_{env}$," is coupled to node 151 (i.e., the RF cold point). At node 153, a second terminal of envelope resistor 152 is coupled to a first terminal of inductance 154, referred to herein as an "envelope inductor" or "$L_{env}$." At node 155, a second terminal of inductance 154 is coupled to capacitor 156, referred to herein as an "envelope capacitor" or "$C_{env}$." A second terminal of the envelope capacitor 156 is coupled to the ground node 157, in an embodiment. Envelope resistor 152 may have a value in a range between about 0.1 Ohm to about 2 Ohm, envelope inductance 154 may have a value that is less than about 25 to about 500 pH, and envelope capacitor 156 may have a value in a range between about 5 nanofarads (nF) to about 1 microfarad (µF), although these components may have values outside of these ranges, as well. Although envelope inductance 154 is shown to include a single lumped element in FIG. 1, envelope inductance 154 actually may be made up of one or more distinct inductors and additional small inductances associated with other conductive features (e.g., conductive vias and portions of conductive traces) present in the conductive path between RF cold point node 151 and ground node 157.

To mitigate VLF resonance (such as those between about 8 MHz and about 20 MHz) in some devices, a supplemental lead circuit that includes an extra lead inductance 170 may be incorporated in parallel with inductance 154, providing another path to ground. An extra lead capacitor 172 may be incorporated in series with extra lead inductance 170, where the extra lead capacitor 172 also forms a portion of the supplemental lead circuit. The extra lead inductance 170 may be coupled between node 151 and a first terminal of extra lead capacitor 172, and a second terminal of the extra lead capacitor 172 may be coupled with the ground node 157. According to various embodiments, the extra lead inductance 170 may have an inductance value in a range of about 100 pH to about 4 nH, and the extra lead capacitor 172 may have a capacitance value in a range of about 1 nF to about 100 microfarads (uF). In other embodiments, the inductance values and/or capacitance values of the inductance 170 and the capacitance 172 may be lower or higher than the above-given ranges.

By placing the extra lead inductance 170 in parallel with the inductance 154, the equivalent inductance of the output circuit including external bias feeds can be reduced. This approach can be used as a deliberate technique of increasing the effective resonance frequency. Because the Q factor for the overall circuit is inversely related to frequency—i.e., Q factor decreases with increasing frequency—adding the parallel extra lead inductance increases the VLF resonance frequency and decreases the overall Q. This principle helps dampen the VLF resonance. The inverse relationship is represented in Equation (1):

$$Q = \frac{1}{\omega \cdot R_{vbw} \cdot C_{vbw}}; \quad (1)$$

where Q is the Q factor, $\omega$ is angular frequency, $R_{vbw}$ is video bandwidth resistance, and $C_{vbw}$ is video bandwidth capacitance.

It is noted that some or all of capacitors 134, 138, 156, envelope resistor 152, and envelope inductor 154 may be integrally formed together, as indicated by the dashed box 160 encompassing these components. At a minimum, the output IPD may include two capacitors (e.g., capacitors 134 and 156, or capacitors 156 and 138). Inclusion of the third capacitor, inductor 154, and/or resistor 152 allows for increased integration of the components of the output circuit, with potential benefits in terms of smaller device size, lower device cost, and/or improved device performance.

Figure 2:
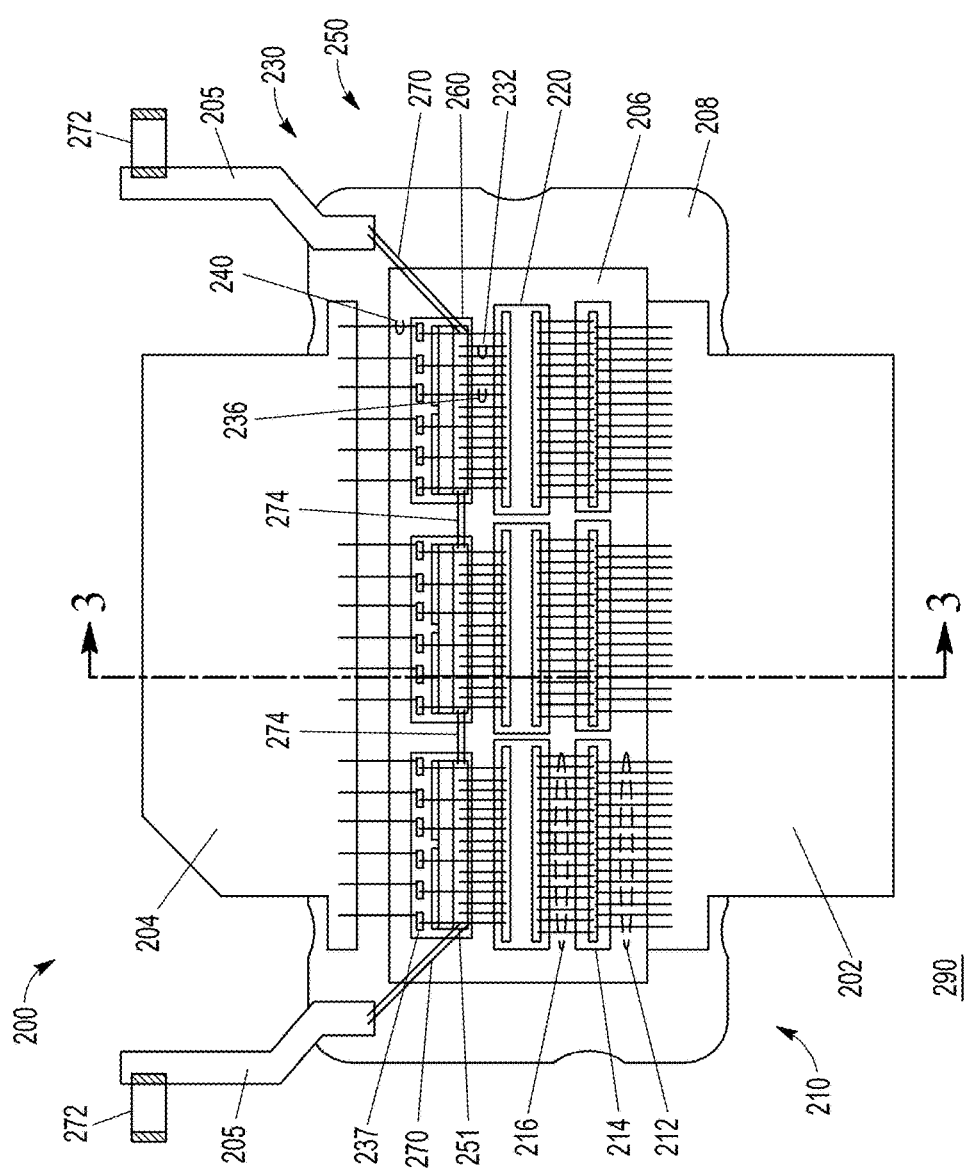
FIG. 2 is a top view of an example of a packaged RF amplifier device that embodies the circuit of FIG. 1, in accordance with an example embodiment.

FIG. 2 is a top view of an example of a packaged RF amplifier device 200 that embodies the circuit of FIG. 1, in accordance with an example embodiment. More particularly, the interconnected electrical components and elements of device 200 may be modeled by the schematic diagram of FIG. 1. For enhanced understanding, FIG. 2 should be viewed in parallel with FIG. 3, which is a cross-sectional, side view of the RF amplifier device 200 of FIG. 2 along line 3-3.

Device 200 includes an input lead 202 (e.g., input lead 102, FIG. 1), an output lead 204 (e.g., output lead 104, FIG. 1), extra leads 205, a flange 206, an isolation structure 208, and three parallel amplification paths (i.e., three parallel instantiations of circuit 100, FIG. 1) electrically coupled between the input and output leads 202, 204. In addition, a capacitor 272, corresponding to the capacitance of the supplemental lead circuit (e.g., capacitor 172, FIG. 1), is also shown in FIG. 2, even though the capacitor 272 may be a discrete device that is distinct from device 200. Each amplification path includes an input impedance matching circuit 210 (e.g., input impedance matching circuit 110, FIG. 1), a transistor 220 (e.g., transistor 120, FIG. 1), an output impedance matching circuit 230 (e.g., output impedance matching circuit 130, FIG. 1), and an envelope frequency termination circuit 250 (e.g., envelope frequency termination circuit 150, FIG. 1). In exemplary embodiments, the extra lead inductance 170 is incorporated into device 200 via bondwires 270 and extra leads 205. Lateral bondwires 274 connect scalable baseband terminations. As will be described in more detail below, portions of the output impedance matching circuit 230 and the envelope frequency termination circuit 250 are implemented in a single device 260, in accordance with an embodiment.

Flange 206 includes a rigid electrically-conductive substrate, which has a thickness that is sufficient to provide structural support for other components and elements of device 200. In addition, flange 206 may function as a heat sink for transistors 220 and other devices mounted on flange 206. Flange 206 has a top and bottom surface and a substantially-rectangular perimeter that corresponds to the perimeter of the device 200. In FIG. 2, only a central portion of the top surface of flange 206 is visible through an opening in isolation structure 208. At least the surface of flange 206 is formed from a layer of conductive material, and possibly all of flange 206 is formed from bulk conductive material. Alternatively, flange 206 may have one or more layers of non-conductive material below its top surface. Either way, flange 206 has a conductive top surface. When device 200 is incorporated into a larger electrical system, flange 206 may be used to provide a ground reference for the device 200.

Isolation structure 208 is formed from a rigid, electrically insulating material (i.e., a material with a dielectric constant in a range from about 3.0 to about 10.0, although materials with higher or lower dielectric constants may be used), and has a top surface and an opposed bottom surface. The term "isolation structure," as used herein, refers to a structure that provides electrical isolation between conductive features of a device (e.g., between leads 202, 204, 205, and flange 206). For example, isolation structure 208 may be formed from inorganic materials (e.g., ceramic such as aluminum oxide, aluminum nitride, and so on) and/or organic materials (e.g., one or more polymers or printed circuit board (PCB) materials). In an embodiment in which isolation structure 208 comprises PCB materials (e.g., the isolation structure 208 essentially includes a single or multi-layer PCB), conductive layers (e.g., copper layers) may be included on the top and bottom surfaces of the isolation structure. In a further embodiment, a conductive layer on the top surface of the isolation structure 208 may be patterned and etched to form a leadframe (including leads 202, 204, 205) for the device 200, and a conductive layer on the bottom surface of the isolation structure 208 may be coupled to the flange 206. In other embodiments, conductive layers may be excluded from the top and/or bottom surface of the isolation structure 208. In such embodiments, leads (e.g., leads 202, 204, 205) may be coupled to the isolation structure 208 using metallurgic connection or epoxy (or other adhesive materials), and/or the isolation structure 208 may be coupled to the flange 206 using metallurgic connection or epoxy (or other adhesive materials). In still other embodiments, the isolation structure 208 may be milled at the portion of its top surface to which a lead is attached.

Isolation structure 208 has a frame shape, in an embodiment, which includes a substantially enclosed, four-sided structure with a central opening. Isolation structure 208 may have a substantially rectangular shape, as shown in FIG. 2, or isolation structure 208 may have another shape (e.g., annular ring, oval, and so on). Isolation structure 208 may be formed as a single, integral structure, or isolation structure 208 may be formed as a combination of multiple members. For example, in an alternate embodiment, isolation structure 208 may include multiple portions that contact each other or that are spatially separated from each other (e.g., isolation structure 208 may have one portion isolating input lead 202 from flange 206, and another portion isolating output lead 204 from flange 206). In addition, isolation structure 208 may be formed from a homogenous material, or isolation structure 208 may be formed from multiple layers.

The input and output leads 202, 204 and the extra leads 205 are mounted on a top surface of the isolation structure 208 on opposed sides of the central opening, and thus the input and output leads 202, 204 and the extra leads 205 are elevated above the top surface of the flange 206, and are electrically isolated from the flange 206. For example, the leads 202, 204, 205 may be soldered or otherwise attached to metallization (not shown) on a top surface of isolation structure 208 (e.g., a metallurgic connection). Generally, the leads 202, 204, 205 are oriented in order to allow for attachment of bondwires (e.g., bondwires 212, 240, 270) between the leads 202, 204, 205 and components and elements within the central opening of isolation structure 208.

Extra leads 205 extend from the device 200, once packaged, so that their distal ends are exposed and may be coupled to a PCB of a larger system. In preferred embodiments the length of extra lead 205 should be kept as short as possible. Capacitors 272 have first terminals coupled to the distal ends of the extra leads 205, and second terminals coupled to a conductive contact on a surface of PCB 290, which in turn may be coupled to a ground reference node for the system.

According to an embodiment, additional bias leads (not shown) also may be included as part of device 200, and additional large value de-coupling capacitors may be connected between the bias leads and ground as the bias leads exit the device package. In another embodiment the extra leads 205 or the bias leads may simply be connected to AC ground without a bias voltage supply in which case separate, external bias feeds may be used.

Another embodiment may include a device with an input lead, an output lead, extra leads, and (optionally) bias leads coupled to the input impedance matching circuit. Yet another embodiment includes a device with an input lead, an output lead, extra leads, (optional) bias leads coupled to the output impedance matching circuit and bias leads coupled to the input impedance matching circuit.

Transistors 220 and various elements 214, 260 of the input and output impedance matching circuits 210, 230 and the envelope frequency termination circuit 250 are mounted on a generally central portion of the top surface of a flange 206 that is exposed through the opening in isolation structure 208. For example, the transistors 220 and elements 214, 260 of the input and output impedance matching circuits 210, 230 and the envelope frequency termination circuit 250 may be coupled to flange 206 using conductive epoxy, solder, solder bumps, sintering, and/or eutectic bonds. As used herein, an "active device area" corresponds to a portion of a device on which one or more active devices (e.g., transistor 220) are mounted (e.g., the portion of the conductive surface of flange 206 that exposed through the opening in isolation structure 208).

Each of transistors 220 has a control terminal (e.g., a gate) and two current conducting terminals (e.g., a drain and a source). The control terminal of each transistor 220 is coupled to the input lead 202 through an input impedance matching circuit 210 (e.g., input impedance matching circuit 110, FIG. 1). In addition, one current conducting terminal (e.g., the drain) of each transistor 220 is coupled to the output lead 204 through an output impedance matching circuit 230 (e.g., output impedance matching circuit 130, FIG. 1), and the other current conducting terminal (e.g., the source) is coupled to the flange 206 (e.g., to a ground reference node for the device 200).

In the device 200 of FIG. 2, each input impedance matching circuit 210 includes two inductive elements 212, 216 (e.g., inductive elements 112, 116, FIG. 1) and a capacitor 214 (e.g., capacitor 114, FIG. 1). Each inductive element 212, 216 is formed from a plurality of parallel, closely-spaced sets of bondwires. For example, a first inductive element 212 (e.g., inductive element 112, FIG. 1) includes a plurality of bondwires coupled between input lead 202 and a first terminal of capacitor 214 (e.g., capacitor 114, FIG. 1), and a second inductive element 216 (e.g., inductive element 116, FIG. 1) includes a plurality of bondwires coupled between the first terminal of capacitor 214 and the control terminal of transistor 220. The second terminal of capacitor 214 is coupled to the flange 206 (e.g., to ground). Capacitor 214 may be, for example, a discrete silicon capacitor (e.g., comprised of a silicon substrate with a top surface corresponding to a first terminal, and a bottom surface corresponding to a second terminal), a discrete ceramic capacitor, or another type of capacitor. Bondwires 212, 216 are attached to a conductive top plate at the top surface of capacitor 214.

In the device 200 of FIG. 2, each output impedance matching circuit 230 includes three inductive elements 232, 236, 240 (e.g., $L_{shunt}$ 132, $L_{LP1}$ 136, and $L_{LP2}$ 140, FIG. 1) and two capacitors (e.g., $C_{shunt}$ 134 and $C_{LP}$ 138, FIG. 1), where the capacitors can be integrated together in a single device 260, in an embodiment. Again, each inductive element 232, 236, 240 is formed from a plurality of parallel, closely-spaced sets of bondwires. For example, shunt inductive element 232 (e.g., $L_{shunt}$ 132, FIG. 1) includes a plurality of bondwires coupled between the first current conducting terminal (e.g., the drain) of transistor 220 and a first bond pad 251 (e.g., corresponding to RF cold point node 151, FIG. 1) on a top surface of the output IPD 260. The first bond pad 251 is electrically coupled to a shunt capacitor (e.g., $C_{shunt}$ 134, FIG. 1) within the output IPD 260. A first series inductive element 236 (e.g., UN 136, FIG. 1) includes a plurality of bondwires coupled between the first current conducting terminal of transistor 220 and a second bond pad 237 (e.g., corresponding to node 137, FIG. 1) on the top surface of the output IPD 260. The second bond pad 237 is electrically coupled to a low pass matching capacitor (e.g., $C_{LP}$ 138, FIG. 1) within the output IPD 260. Finally, a second series inductive element 240 (e.g., $L_{LP2}$ 140, FIG. 1) is coupled between the second bond pad 237 and the output lead 204. Second terminals of the shunt and LP-match capacitors within the output IPD 260 are coupled to the flange 206 (e.g., to ground).

According to an embodiment, device 200 is incorporated in an air cavity package, in which transistors 220 and various impedance matching and envelope frequency termination elements are located within an enclosed air cavity 312. Basically, the air cavity is bounded by flange 206, isolation structure 208, and a cap 310 overlying and in contact with the isolation structure 208 and leads 202, 204, 205. In other embodiments, a device may be incorporated into an overmolded package (i.e., a package in which the electrical components within the active device area are encapsulated with a non-conductive molding compound, and in which portions of the leads 202, 204 also may be encompassed by the molding compound).

Figure 3:
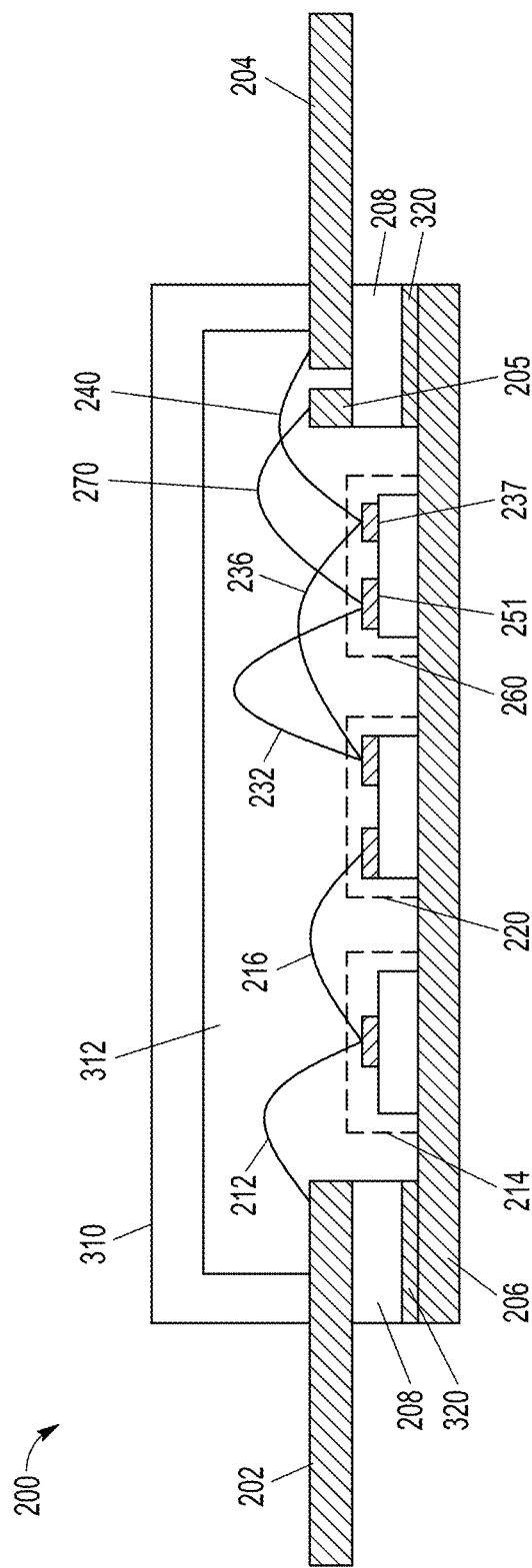
FIG. 3 is a cross-sectional, side view of the RF amplifier device of FIG. 2 along line 3-3.
Figure 4:
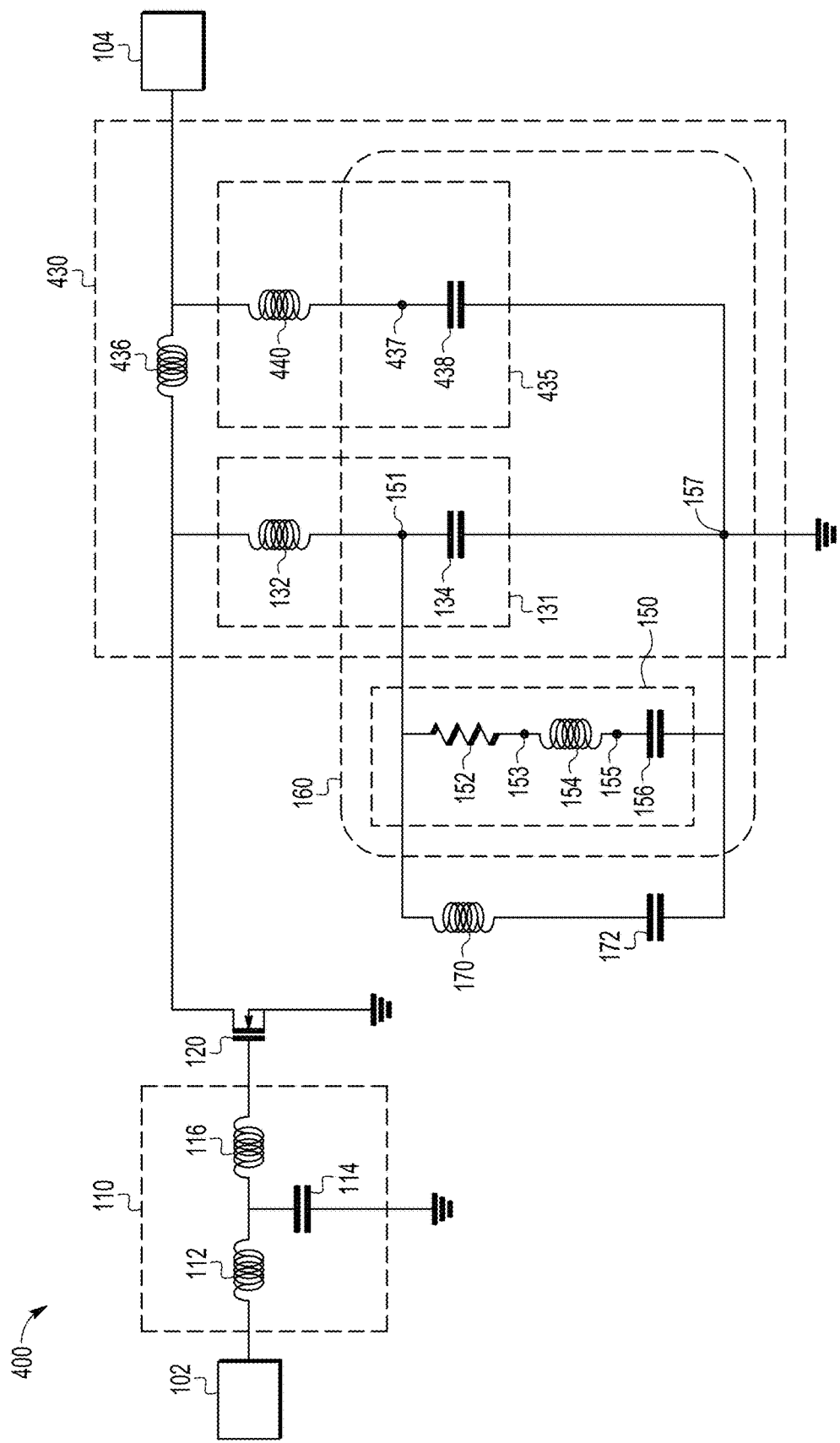
FIG. 4 is a schematic diagram of an RF amplifier with input and output circuits, in accordance with another example embodiment.

In the embodiments discussed in conjunction with FIGS. 1-3, the output impedance matching circuit 130, 230 includes a high-pass shunt circuit 131 and a low-pass, LP-match circuit 135 (e.g., including inductive elements 136, 140 or bondwires 236, 240 and capacitor 138). In an alternate embodiment, the low-pass matching circuit 135 may be replaced with a differently-configured matching circuit. For example, FIG. 4 is a schematic diagram of an RF amplifier 400 with a second matching circuit 435 (e.g., a low-pass matching circuit with a very high frequency resonance) forming a portion of its output impedance matching circuit 430, in accordance with another example embodiment. Except for the replacement of low-pass matching circuit 135 with matching circuit 435, and the replacement of inductive element 136 with inductive element 436, RF amplifier 400 may be substantially similar to the amplifier 100 of FIG. 1, and like reference numbers are used in both drawings to indicate elements that may be substantially the same between the two embodiments.

In device 400, inductive element 436, or "$L_{series}$," is coupled directly between the first current conducting terminal (e.g., drain) of transistor 120 and the output lead 104. In addition, the low-pass matching circuit 435, which includes a "bond back" or "BB" inductive element 440 coupled in series with a BB capacitor 438, is coupled between the output lead 104 and the ground node 152. More specifically, $L_{BB}$ 440 is coupled between the output lead 104 and a node 437, and $C_{BB}$ 438 is coupled between node 437 and the ground node 157. According to an embodiment, $L_{series}$ 436 may have a value in a range between about 50 pH to about 3 nH, $L_{BB}$ 440 may have a value in a range between about 50 pH to about 500 pH, and $C_{BB}$ 438 may have a value in a range between about 2 pF to about 50 pF, although these components may have values outside of these ranges, as well.

Some or all of capacitors 134, 438, 156, envelope resistor 152, and envelope inductor 154 may be integrally formed portions of the aforementioned single IPD, as indicated by the dashed box 460 encompassing these components. At a minimum, the single IPD may include two capacitors (e.g., capacitors 134 and 156, or capacitors 156 and 438) with different dielectric materials between their respective electrodes.

In alternative embodiments, inductive element 140 and capacitor 138 may be omitted from the exemplary RF amplifier represented in FIG. 1, or analogously, inductive element 440 and capacitor 438 may be omitted from the exemplary RF amplifier represented in FIG. 4. These modifications would, in effect, eliminate the low-pass matching circuit 135 (FIG. 1)/low-pass matching circuit 435 (FIG. 4), leaving inductive element 136 (FIG. 1)/inductive element 436 (FIG. 4) coupled between the first current conducting terminal of transistor 120 and the output lead 104. These alternative versions may be implemented using, for example, semiconductor packages with transistors based on GaN (gallium nitride).

Figure 5:
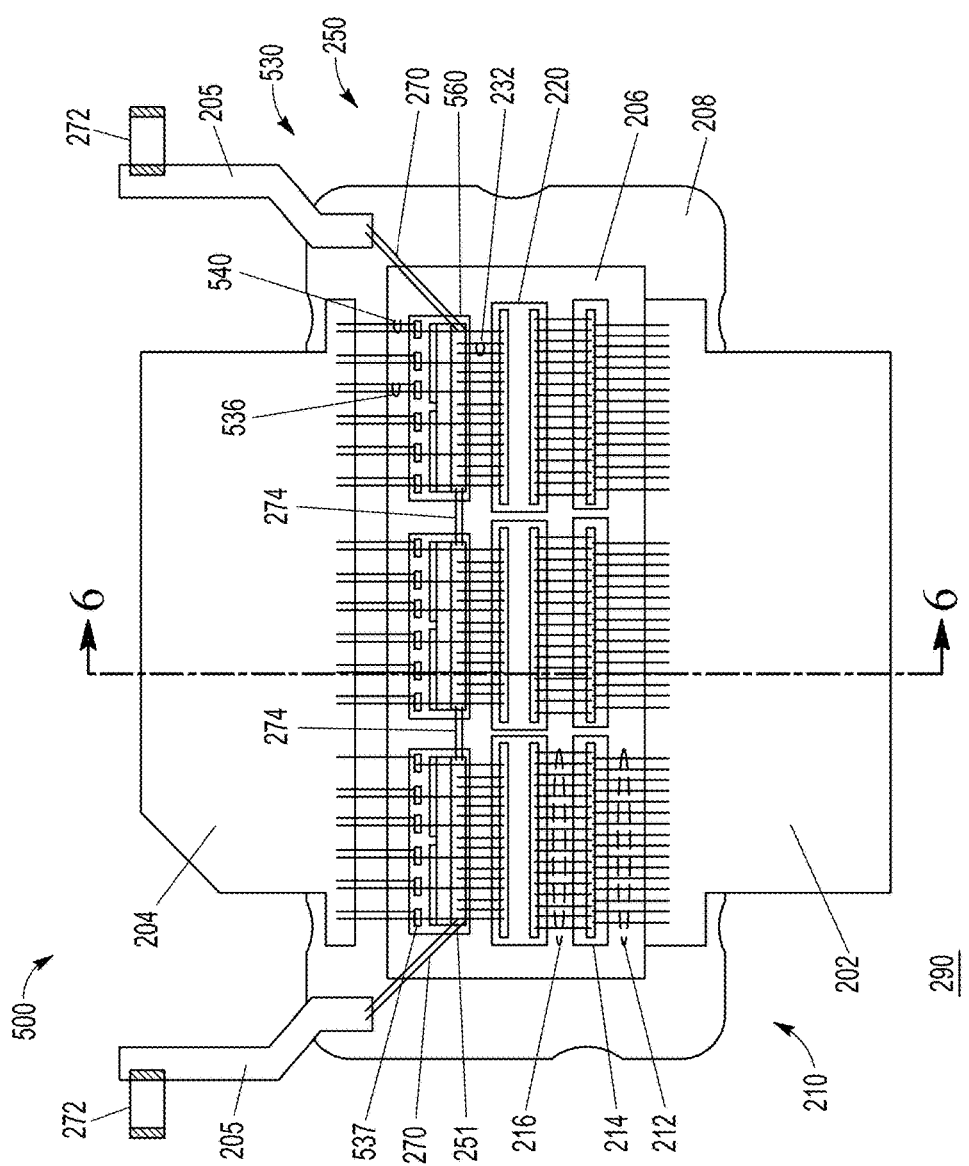
FIG. 5 is a top view of an example of a packaged RF amplifier device that embodies the circuit of FIG. 4, in accordance with an example embodiment.
Figure 6:
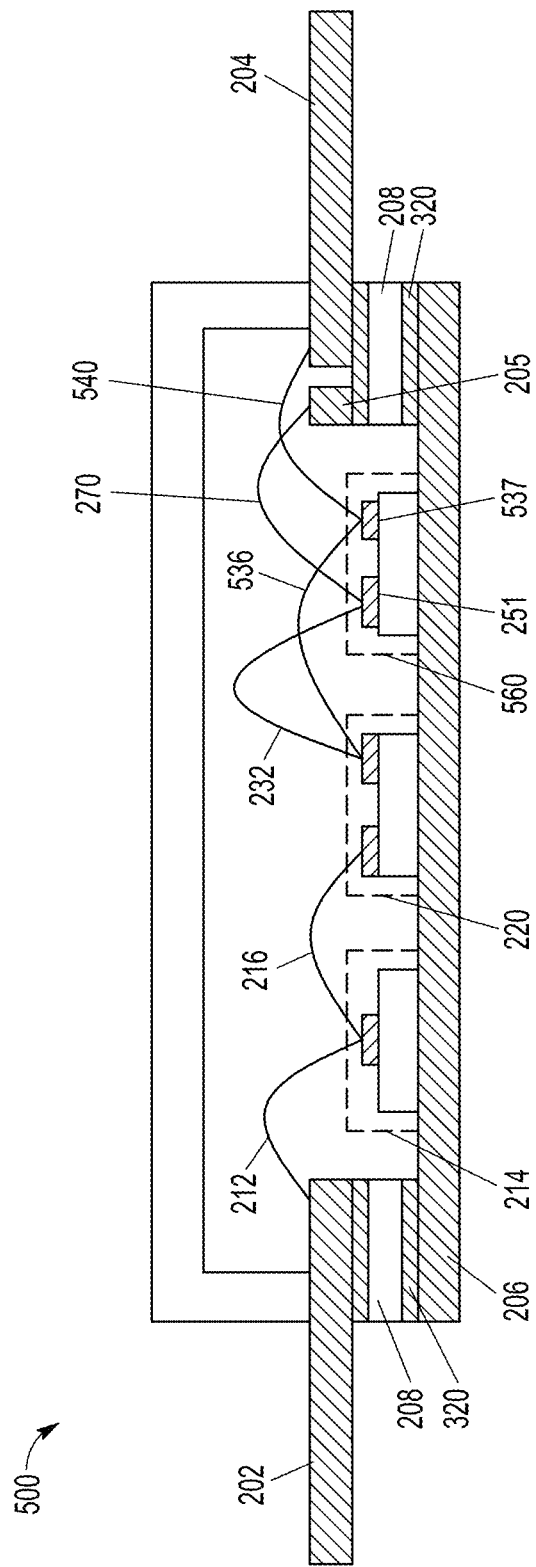
FIG. 6 is a cross-sectional, side view of the RF amplifier device of FIG. 5 along line 6-6.

FIG. 5 is a top view of an example of a packaged RF amplifier device 500 that embodies the circuit of FIG. 4, in accordance with an example embodiment. More particularly, the interconnected electrical components and elements of device 500 may be modeled by the schematic diagram of FIG. 4. For enhanced understanding, FIG. 5 should be viewed in parallel with FIG. 6, which is a cross-sectional, side view of the RF amplifier device 500 of FIG. 5 along line 6-6. Except for the replacement of low-pass matching circuit 135 with low-pass matching circuit 435, and the replacement of inductive element 136 with inductive element 436, packaged RF amplifier device 500 may be substantially similar to the device 200 of FIGS. 2 and 3, and like reference numbers are used in both drawings to indicate elements that may be substantially the same between the two embodiments.

In the device 500 of FIG. 5, each output impedance matching circuit 530 includes three inductive elements 232, 536, 540 (e.g., $L_{shunt}$ 132, $L_{series}$ 436, and $L_{BB}$ 440, FIG. 4) and two capacitors (e.g., $C_{shunt}$ 134 and $C_{BB}$ 438, FIG. 4), where the capacitors form portions of output IPD 560 (e.g., output IPD 460, FIG. 4), in an embodiment. Again, each inductive element 232, 536, 540 is formed from a plurality of parallel, closely-spaced sets of bondwires. For example, shunt inductive element 232 (e.g., $L_{shunt}$ 132, FIG. 4) includes a plurality of bondwires coupled between the first current conducting terminal (e.g., the drain) of transistor 220 and a first bond pad 251 (e.g., corresponding to RF cold point node 151, FIG. 4) on a top surface of the output IPD 560. The first bond pad 251 is electrically coupled to a shunt capacitor (e.g., $C_{shunt}$ 134, FIG. 4) within the output IPD 560. A series inductive element 536 (e.g., $L_{series}$ 436, FIG. 4) includes a plurality of bondwires coupled between the first current conducting terminal of transistor 220 and the output lead 204. A bond back inductive element 540 (e.g., $L_{BB}$ 440, FIG. 4) is coupled between the output lead 204 and a second bond pad 237 (e.g., corresponding to node 437, FIG. 4) on the top surface of the output IPD 260. The second bond pad 437 is electrically coupled to a bond back capacitor (e.g., $C_{BB}$ 438, FIG. 4) within the output IPD 560. Second terminals of the shunt and bond back capacitors within the output IPD 560 are coupled to the flange 206 (e.g., to ground). In exemplary embodiments, the extra lead inductance 170 is incorporated into device 500 via bondwires 270. Lateral bondwires 274 connect scalable baseband terminations.

The exemplary approach to mitigating VLF resonance using an extra lead inductance can provide enhanced scaling, allowing the technique to be scaled to higher power devices (for example, devices with greater numbers of die blocks) with little to no reduction in the frequency of the primary baseband resonance, and with little or no compromise to baseband impedances experienced by individual die blocks. As the VBW circuit is scaled up in size, the total circuit baseband decoupling capacitance may increase, and the effectiveness of the total series R damping resistance may be reduced. This behavior can result in insufficiently-damped VLF resonance that represents a long term memory effect disrupting near carrier DPD correction.

The extra lead inductance reduces equivalent shunt baseband inductance of the circuit, thereby raising the frequency of the VLF resonance. The Q factor of the overall circuit drops as frequency increases, allowing the total series R in the VBW circuit to provide effective damping of the resonance. The extra leads can help dampen the VLF resonance (around 8 to 20 MHz), reduce DPD complexity, and power consumption resulting from the long term memory effect, and improve corrected Adjacent Channel Power Ratio (ACPR) performance near the carrier frequencies. It is noted that VLF resonance damping can be realized using only one extra lead inductance, thereby reducing the required PCB area, while providing significantly cleaner baseband terminations than conventional approaches. It is also noted that while the discussion has focused on a "1-up" (i.e., 1-path) implementation, in other embodiments, the approach can be applied to multiple path (for example, 2-up and 3-up) applications. Multiple-path implementations can use inductive elements to connect the paths together.

Figure 7:
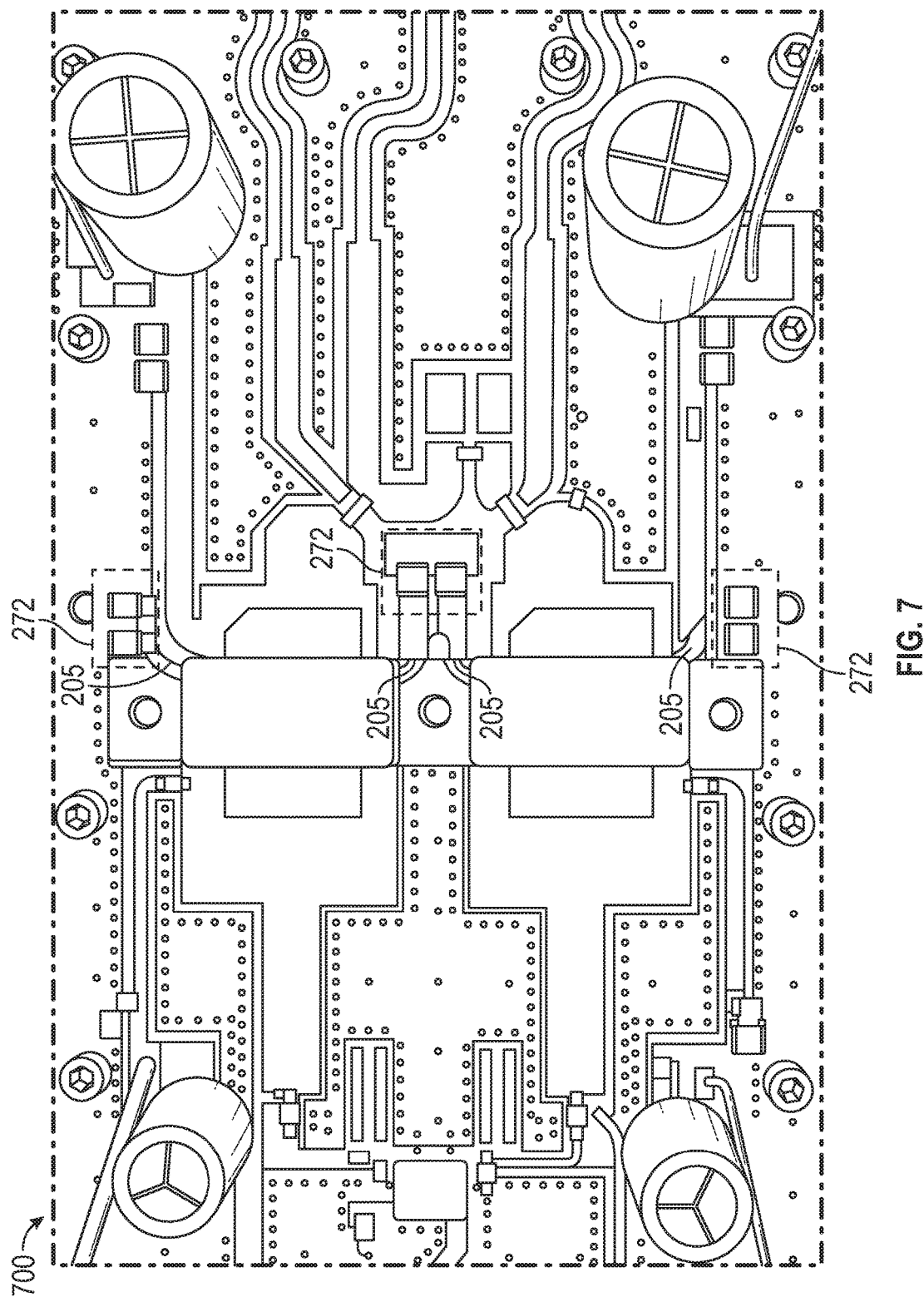
FIG. 7 is a diagram illustrating a 2-way symmetric Doherty power amplifier circuit, in accordance with an example embodiment.

To demonstrate the baseband and RF matching capabilities of embodiments of the power amplifier device, a 400 W, 2-way symmetric Doherty power amplifier may be constructed to enable a 1.805-2.2 GHz cellular infrastructure application. An embodiment of such a Doherty power amplifier circuit including bias network may be relatively small (e.g., measuring approximately 12 cm by 7.5 cm), and is shown in FIG. 7. More specifically, FIG. 7 is a diagram illustrating a 2-way symmetric Doherty power amplifier circuit 700, in accordance with an example embodiment. Doherty power amplifier circuit 700 depicts two parallel packaged amplifier devices, each with an extra lead 205 and a capacitor 272 corresponding to the capacitance of the supplemental lead circuit (e.g., capacitor 172, FIG. 1). In the illustrated embodiment, the capacitor 272 is actually embodied as two chip capacitors coupled in parallel between the extra lead 205 and a ground reference on the PCB.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first," "second," and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A radio frequency (RF) amplifier device comprising:
   a transistor with a control terminal and first and second current carrying terminals;
   a shunt circuit coupled between the first current carrying terminal and a ground reference node, the shunt circuit having a shunt inductive element and a shunt capacitor coupled in series, with an RF cold point node present between the shunt inductive element and the shunt capacitor;
   an envelope frequency termination circuit coupled between the RF cold point node and the ground reference node, the envelope frequency termination circuit having an envelope resistor, an envelope inductive element, and an envelope capacitor coupled in series;
   a first lead that is electrically coupled to the RF cold point node, wherein the first lead provides a lead inductance coupled in parallel with an envelope inductance provided by the envelope inductive element;
   a first inductive element that is electrically coupled between the RF cold point node and the first lead; and
   an isolation structure that is substantially electrically insulating, wherein the first lead extends from the isolation structure.

2. The RF amplifier device of claim 1 further comprising a lead capacitor coupled:
   in series with the lead inductance; and
   in parallel with the envelope capacitor.

3. The RF amplifier device of claim 1, wherein the first inductive element includes a plurality of bondwires coupled between the RF cold point node and the first lead, wherein the plurality of bondwires provides an additional inductance in series with the lead inductance, and in parallel with the envelope inductance.

4. The RF amplifier device of claim 1 further comprising:
   an input lead; and
   an impedance matching circuit coupled between the input lead and the control terminal of the transistor, wherein the impedance matching circuit is a low-pass filter or a band-pass filter.

5. The RF amplifier device of claim 4 wherein the impedance matching circuit comprises a first inductive element, a second inductive element, and a capacitor having a first terminal and a second terminal, wherein:
   the first inductive element is coupled between the input lead and a first terminal of the capacitor;
   the second inductive element is coupled between the first terminal of the capacitor and the control terminal of the transistor; and
   the second terminal of the capacitor is coupled to the ground reference node.

6. The RF amplifier device of claim 1 further comprising:
   an output lead; and
   a low-pass matching circuit coupled between the first current carrying terminal of the transistor and the output lead.

7. The RF amplifier device of claim 6 wherein the low-pass matching circuit comprises a first inductive element, a second inductive element, and a capacitor having a first terminal and a second terminal, wherein:
   the first and second inductive elements are coupled in series between the first current conducting terminal of the transistor and the output lead, with a node between the first and second inductive elements; and the first terminal of the capacitor is coupled to the node, and the second terminal of the capacitor is coupled to the ground reference node.

8. The RF amplifier device of claim 1 wherein the shunt inductive element comprises a plurality of bondwires coupled between the first current carrying terminal and the RF cold point node.

9. The RF amplifier device of claim 1, wherein the envelope inductive element comprises a plurality of bondwires or spiral inductors coupled between the RF cold point node and a first terminal of the envelope capacitor.

10. A packaged radio frequency (RF) amplifier device comprising:
a device substrate;
a transistor coupled to the device substrate, wherein the transistor includes a control terminal and first and second current carrying terminals;
a shunt circuit coupled between the first current carrying terminal and a ground reference node, the shunt circuit having a shunt inductive element and a shunt capacitor coupled in series, with an RF cold point node present between the shunt inductive element and the shunt capacitor;
an envelope frequency termination circuit coupled between the RF cold point node and the ground reference node, the envelope frequency termination circuit having an envelope resistor, an envelope inductive element, and an envelope capacitor coupled in series;
a first lead;
a first inductive element that is electrically coupled between the RF cold point node and the first lead, wherein the first lead and the first inductive element provide a lead inductance coupled in parallel with an envelope inductance provided by the envelope inductive element;
an isolation structure that is substantially electrically insulating, wherein the first lead extends from the isolation structure; and
a bond pad corresponding to the RF cold point node, and wherein the first inductive element comprises a plurality of bondwires coupled between the bond pad and the first lead.

11. The packaged RF amplifier device of claim 10 wherein:
the bond pad is a first bond pad; and
the device further includes a second bond pad and a plurality of bondwires coupling the first and second bond pads.

12. The packaged RF amplifier device of claim 10 wherein the first lead comprises an exposed distal end extending out from the device.

13. The packaged RF amplifier device of claim 10 further comprising:
a second transistor coupled to the device substrate, wherein the second transistor includes a second control terminal and third and fourth current carrying terminals;
a second shunt circuit coupled between the third current carrying terminal and the ground reference node, the second shunt circuit having a second shunt inductive element and a second shunt capacitor coupled in series, with a second RF cold point node present between the second shunt inductive element and the second shunt capacitor;

a second envelope frequency termination circuit coupled between the second RF cold point node and the ground reference node, the second envelope frequency termination circuit having a second envelope resistor, a second envelope inductive element, and a second envelope capacitor coupled in series;
a second lead; and
a second inductive element that is electrically coupled between the second RF cold point node and the second lead, wherein the second lead and the second inductive element provide a second lead inductance coupled in parallel with a second envelope inductance provided by the second envelope inductive element.

14. The packaged RF amplifier device of claim 13 wherein the second inductive element comprises a second plurality of bondwires coupled between the second RF cold point node and the second lead.

15. The packaged RF amplifier device of claim 13 wherein:
each of the first and second leads includes a distal end and a proximal end; and
the distal ends extend out from the device and are exposed.

16. The packaged RF amplifier device of claim 10 wherein the shunt inductive element comprises a plurality of bondwires coupled between the first current carrying terminal and the RF cold point node.

17. The packaged RF amplifier device of claim 10 wherein the envelope inductive element comprises a plurality of bondwires or spiral inductors coupled between the RF cold point node and a first terminal of the envelope capacitor.

18. A radio frequency (RF) amplifier device comprising:
an input lead and an output lead;
a transistor with a control terminal and first and second current carrying terminals;
an impedance matching circuit coupled between the input lead and the control terminal of the transistor, and a low-pass matching circuit coupled between the first current carrying terminal of the transistor and the output lead;
a shunt circuit coupled between the first current carrying terminal and a ground reference node, the shunt circuit having a shunt inductive element and a shunt capacitor coupled in series, with an RF cold point node present between the shunt inductive element and the shunt capacitor;
an envelope frequency termination circuit coupled between the RF cold point node and the ground reference node, the envelope frequency termination circuit having an envelope resistor, an envelope inductive element, and an envelope capacitor coupled in series;
a supplemental lead circuit coupled between the RF cold point node and the ground reference node, the supplemental lead circuit having a first lead, a lead inductive element and a lead capacitor coupled in series; and
an isolation structure that is substantially electrically insulating, wherein the first lead extends from the isolation structure.

19. The RF amplifier device of claim 18 wherein the lead inductive element comprises:
a plurality of bondwires coupled between the RF cold point node and the first lead.

* * * * *